United States Patent [19]
Liu et al.

[11] 4,437,025
[45] Mar. 13, 1984

[54] MOS BUFFER FOR RECEIVING TTL LEVEL SIGNALS

[75] Inventors: Wei-Ti Liu, San Jose; Douglas J. Lee, Santa Clara, both of Calif.

[73] Assignee: Intel Corporation, Santa Clara, Calif.

[21] Appl. No.: 287,889

[22] Filed: Jul. 29, 1981

[51] Int. Cl.³ .......................................... H03K 19/094
[52] U.S. Cl. .................... 307/475; 307/584; 307/270; 307/450
[58] Field of Search ............... 307/264, 270, 279, 450, 307/475, 584, 585, DIG. 1

[56] References Cited

U.S. PATENT DOCUMENTS

| | | | |
|---|---|---|---|
| 4,048,518 | 9/1977 | Koo | 307/482 X |
| 4,096,398 | 6/1978 | Khaitan | 307/270 X |
| 4,101,788 | 7/1978 | Baker | 307/450 |
| 4,256,974 | 3/1981 | Padgett et al. | 307/270 X |
| 4,258,272 | 3/1981 | Huang | 307/475 |
| 4,264,829 | 4/1981 | Misaizu | 307/475 X |

FOREIGN PATENT DOCUMENTS 5274250 12/1975 Japan .................................. 307/264

*Primary Examiner*—Larry N. Anagnos
*Assistant Examiner*—David R. Bertelson
*Attorney, Agent, or Firm*—Blakely, Sokoloff, Taylor & Zafman

[57] ABSTRACT

An MOS buffer is described which converts TTL level signals to MOS level signals. An inverter which receives the input TTL signal is coupled to ground through a reference voltage source. This source assures that the inverter does not conduct when the TTL level signal is in its lower state. The output of the inverter is coupled to a level shifter which assures that the output of the inverter is shifted downward when the TTL signal is in its higher state. The transistors in the buffer may have short channels unlike prior art circuits.

9 Claims, 3 Drawing Figures

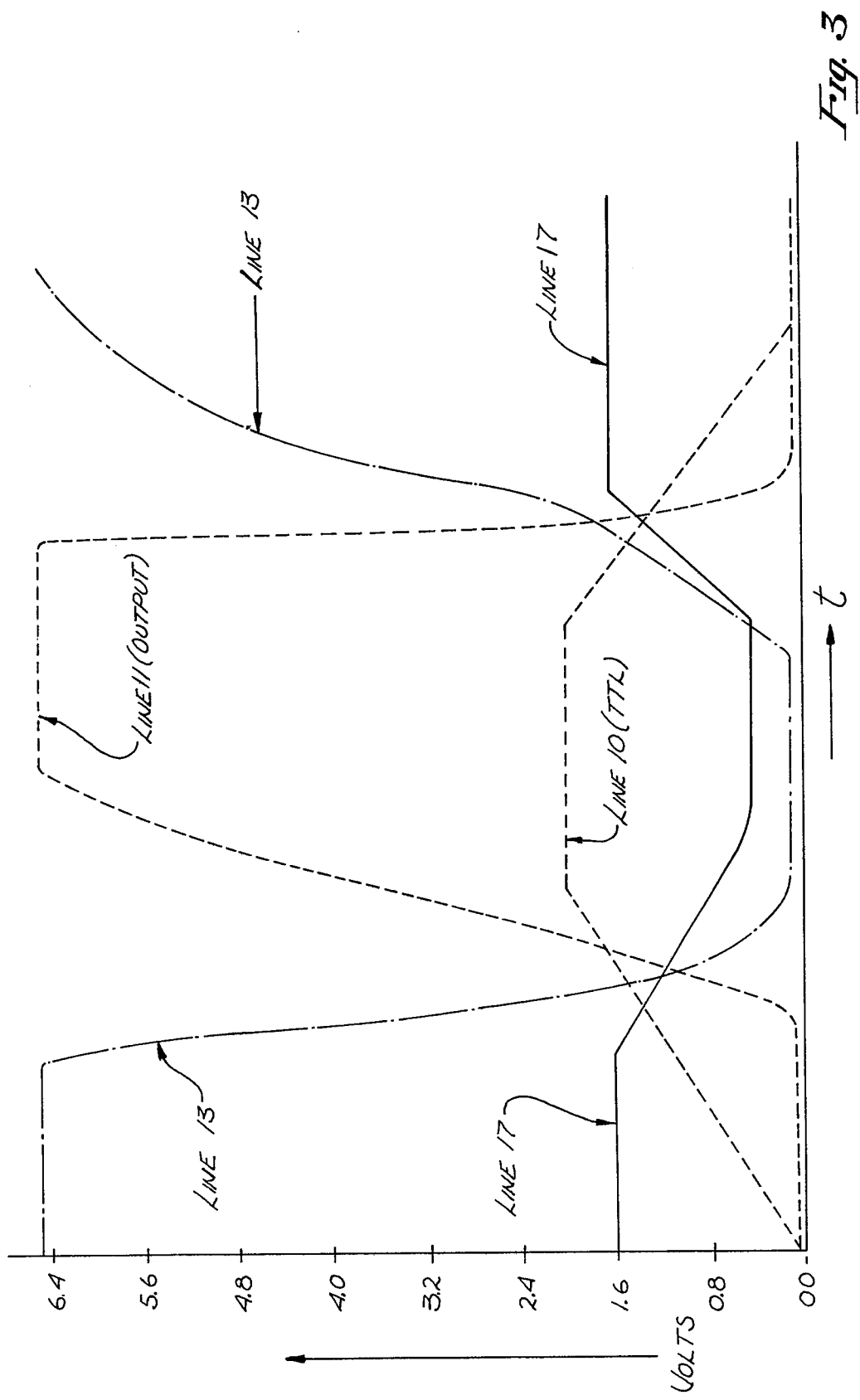

MOS BUFFER FOR RECEIVING TTL LEVEL SIGNALS

BACKGROUND OF THE INVENTION

1. Field of the Invention

The invention relates to the field of MOS buffers, particularly those which receive TTL level signals and convert them to MOS level signals.

2. Prior Art

It is frequently necessary to convert binary signals which operate between first levels, to binary signals which operate between second levels. For example, signals compatible with emitter-coupled-logic are frequently converted to signal compatible with transistor-transistor logic (TTL). The present invention is particularly useful for converting TTL signals to signals compatible with metal-oxide-semiconductor (MOS) integrated circuits.

There are many circuits known in the prior art for converting TTL level signals to MOS level signals. Perhaps the closest prior art circuit for such conversion consists of an inverter, more specifically, a depletion mode transistor used as a load device coupled in series with an enhancement mode transistor. The TTL level signals are coupled to the gate of the enhancement mode transistor; the common junction between the two transistors provides an output signal.

For satisfactory operation of such an inverter, the transistors must be relatively large. For example, with current n-channel MOS technology, the length-to-width ratio of the input transistors are in the range of 150/5 to 250/5. If shorter channels are used, the lower level of the TTL signal may cause substantial conduction in the inverter and thus degrade the performance of the inverter. Even using these larger devices, the inverter's performance is not always satisfactory.

Other MOS buffers for converting TTL signals to MOS level signals are described in U.S. Pat. No. 4,048,518.

SUMMARY OF THE INVENTION

An integrated circuit buffer is described which converts a first binary signal operating between first levels to a second binary signal which operates between second levels. The circuit includes an inverter coupled to receive the first binary signal as an input signal. A reference voltage means for providing a reference voltage for the inverter is coupled to the inverter. Circuit means are used which provides a current path for the reference means when the first binary signal is at one of its levels. A level shifting means is coupled to the output of the inverter and shifts the output from the inverter when the first binary signal is at its other level. The field-effect transistors used in the fabrication of the presently preferred embodiment can be relatively small when compared to the devices in the prior art buffers.

BRIEF DESCRIPTION OF THE DRAWINGS

FIG. 3 is a graph showing the waveforms on various nodes of the invented buffer during operation of the buffer.

DETAILED DESCRIPTION OF THE INVENTION

An MOS integrated circuit buffer is described which is particularly useful for converting a TTL level signal to an MOS level signal. In the following description, numerous specific details are set forth, such as specific device sizes in order to provide a thorough understanding of the present invention. It will be obvious, however to one skilled in the art that the present invention may be practiced without these specific details. In other instances, well-known devices and fabrication processes are not described in detail in order not to obscure the present invention in unnecessary detail.

In the presently preferred embodiment, the buffer is fabricated on a low conductivity (50 ohm-cm) p-type, monocrystalline silicon substrate. N-channel field-effect transistors with polysilicon gates are fabricated on the substrate. As presently fabricated, the buffer uses enhancement mode transistors which have a nominal threshold voltage of approximately 0.8 volts and depletion mode transistors which have a nominal threshold voltage of approximately $-3$ volts. Due to typical process variations, the threshold voltage of the enhancement mode transistors varies between approximately 0.5 volts and approximately 1.0 volts, and the depletion mode transistors varies between approximately $-3.5$ volts and $-3.0$ volts.

Figure 1:
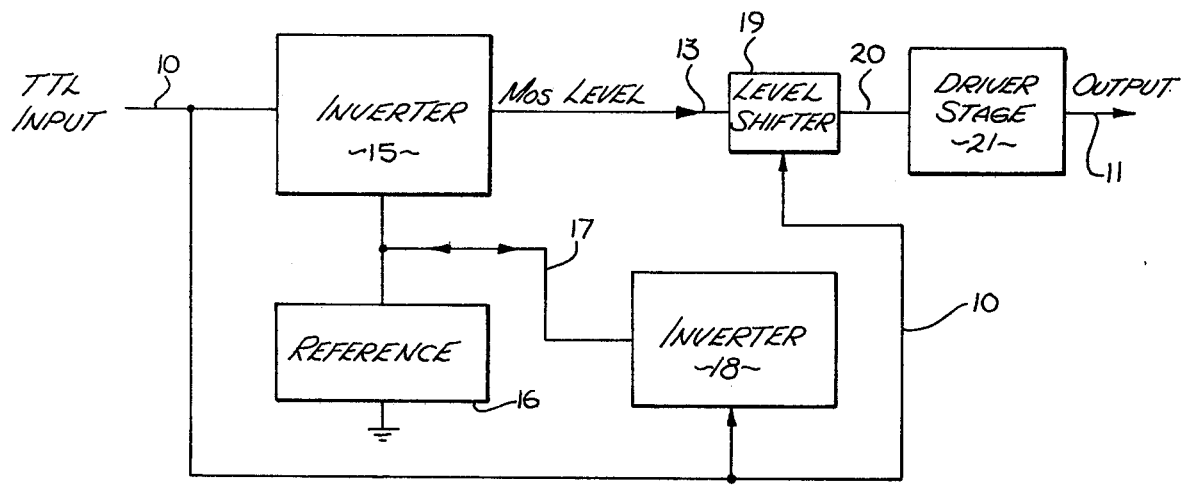
FIG. 1 is a block diagram of the invented buffer.

Referring now to FIG. 1, the invented buffer includes an inverter 15 which receives an input TTL signal on line 10. The inverter 15 is coupled to ground through a reference voltage means 16. The common junction between the inverter 15 and reference voltage means is coupled by line 17 to a second inverter 18. The state of this inverter is controlled by the input signal and thus the inverter is coupled to line 10. The MOS level output signals (line 13) from the inverter 15 is coupled to a level shifter 19. This level shifter is controlled by the input signal on line 10. The output of the shifter 20 is coupled to a push-pull driver stage 21 and a final output signal is provided on line 11.

In general, the TTL binary input signal is either in its low state of less than 0.8 volts, or high state of greater than 2.0 volts. These voltages, of course, vary particularly due to temperature as do the threshold voltages of MOS devices which exacerbate the situation with unwanted conduction. In a worse case condition the lower state of the binary signal could be as low as 0.0 volts or as high as 0.8 volts. This latter potential is troublesome for an MOS inverter since it may cause substantial conduction, thereby lowering the output signal from the inverter.

Conversely, the "high" side of the binary signal could be as low as 2.0 v or as high as 5 v. The former voltage likewise may be troublesome for an MOS inverter if the enhancement pulldown device is designed to minimize conduction for the previous state thereby causing a degradation in the output low level.

The reference voltage means 16 is principally used to bias the inverter 15 such that the inverter does not conduct when the TTL input signal is in its lower state. A current path for the reference voltage means 16 is provided by line 17 during this condition. During the transition of the input signal from the low state to the high state, a current path is provided via line 17 and inverter 18, to speed-up the transition of inverter 15. The level shifter 19 is primarily used to reduce the level of the MOS signal on line 13 when the input signal is in its high state.

Figure 2:
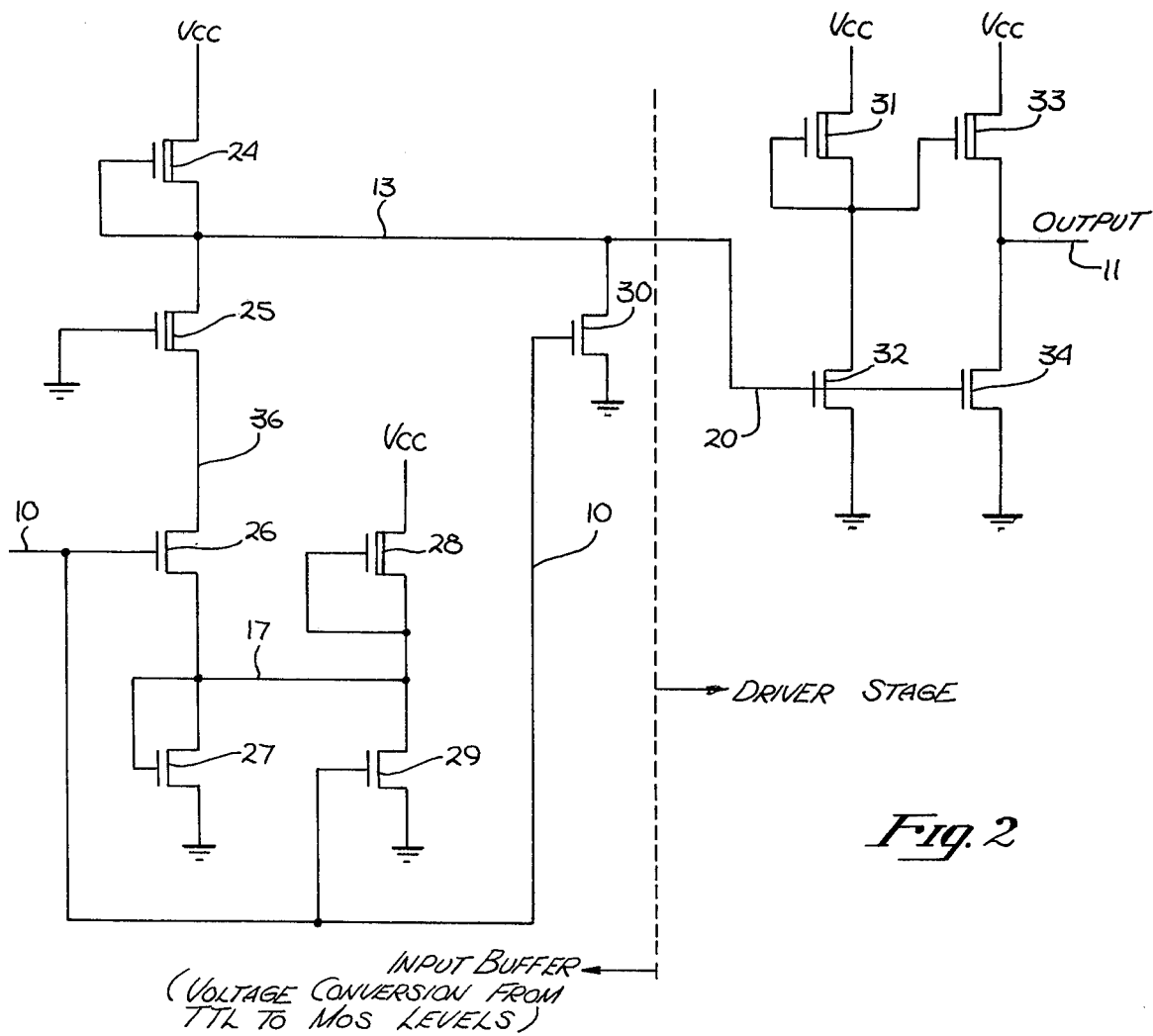
FIG. 2 is an electrical schematic showing the presently preferred embodiment of the invented buffer.

Referring now to FIG. 2, the inverter 15 of FIG. 1 is realized primarily as the depletion mode transistor 24 and enhancement mode transistor 26. The depletion mode transistor 25 with its gate coupled to ground is coupled in series with transistors 24 and 26 for reasons which will be described. The transistor 24 acts as a load device, its gate being coupled to its source terminal. Its source terminal is coupled to line 13, which line provides an output signal from the inverter. The enhancement mode transistor receives the input signal, line 10.

In the presently preferred embodiment the reference voltage means 16 of FIG. 1 is realized as an enhancement mode transistor, transistor 27 of FIG. 2, which is coupled to operate as a diode. The gate of this transistor is coupled to its drain terminal which terminal is common to the source terminal of transistor 26.

The inverter 18 of FIG. 2 is realized as a depletion mode transistor 28 and an enhancement mode transistor 29. The gate of transistor 29 is coupled to receive the input signal, line 10. The gate of transistor 28 is coupled to the source terminal of this transistor and this common terminal is coupled by line 17 to the common terminal between transistors 26 and 27.

The level shifter 19 of FIG. 1 is realized as transistor 30 in FIG. 2. This transistor is coupled between line 13 and ground. The gate of this transistor is coupled to receive the input signal. The shifted signal from the level shifter (line 20) is coupled to a well-known driver stage. As shown in FIG. 3, the push-pull driver stage is realized as the depletion mode transistor 31 coupled in series with the enhancement mode transistor 32 and the depletion mode transistor 33 coupled in series with the enhancement mode transistor 34. The gates of transistors 32 and 34 are coupled to line 20. The gate of transistor 33 is driven by a signal developed between the transistors 31 and 32. An output signal (line 11) is obtained from the common terminal between the transistors 33 and 34.

When the input signal is in its lower state, transistor 26 does not conduct. Transistors 29 and 30 likewise do not conduct although these transistors may conduct a small amount depending upon particular threshold voltages, temperatures and the magnitude of the input signal. During these conditions, current flows through transistor 28, line 17 and through the transistor 27. Transistor 27 biases the source of transistor 26 by a voltage equal to one threshold voltage. Note that since transistors 26 and 27 are fabricated on the same substrate and since they are subjected to the same temperatures, they have the same threshold voltage. The gate to source voltage on transistor 26 will be below the threshold voltage for this transistor when the TTL signal is in its lower state. Thus, transistor 27 assures that transistor 26 will not conduct (or conduct very little) when the input signal is low. Since transistor 26 is not conducting, line 13 is pulled to the VCC potential by transistor 24. Note that even if transistor 30 is conducting slightly, it will not pull line 13 down low enough to affect the operation of the driver stage. The relative size of transistors 24 and 30 is selected to assure that even under worse case conditions (some conduction of transistor 30 when the TTL signal is in its low state) sufficient potential exists on line 20 to provide full conduction of transistors 32 and 34.

When the potential on line 10 rises, transistor 26 begins to conduct. Simultaneously with this conduction, transistors 29 and 30 begin conducting as this conduction increases. The path through line 17 and transistor 29 allows current from transistor 26 to flow to ground not only through transistor 27 but also through transistor 29. This additional current path allows for a quicker transition for the inverter 15. With inverter 15 conducting, ignoring for a moment the effect of transistor 30 on line 13, line 13 will be above ground potential particularly because the voltage drops associated with transistors 25, 26 and 27. The potential on line 13 could be of sufficient magnitude to cause transistors 32 and 34 to conduct. To prevent this from occurring, transistor 30 shifts the level of line 13 towards ground and assures that line 20 is below the threshold voltage of transistors 32 and 34. Thus, when the TTL input signal on line 10 is in its high state, transistors 32 and 34 will not conduct and the output state on line 11 will be high.

The transistor 25 adds an additional voltage drop which limits the drop in potential of node 36. This adds to the speed of the circuit.

In the presently preferred embodiment, as mentioned, n-channel transistors are employed with the following device sizes (channel length over width in microns):

Transistor 24—10/20
Transistor 25—10/10
Transistor 26—15/5
Transistor 27—30/5
Transistor 28—10/25
Transistor 29—30/5
Transistor 30—30/5

Referring to FIG. 3, the waveforms for a worse case condition are shown. The TTL signal line 10 is shown first in a low state at time 0. At time 0, line 13 is at a potential of approximately 6.4 volts. (It is assumed that VCC is approximately 6.5 volts, much higher than the nominal 5 volts generally used.) Initially, line 17 is at approximately 1.6 volts, the "diode" drop associated with transistor 27. As the TTL signal rises, line 13 drops quite low. Some of the charge from this line is drawn off through transistors 25 and 26, and through transistors 27 and 29. However, this line is shifted to a lower potential because of the conduction of transistor 30. When the TTL signal is in its higher state, the potential on line 17 is drawn closer to ground because transistor 29 conducts. The output signal on line 11 rises substantially to VCC (less the drop associated with transistor 33).

When the TTL signal drops in potential, line 13 is again drawn to VCC by transistor 24. The rise in potential on this line is particularly fast once transistor 30 ceases to conduct. The potential on line 17 again rises to the "diode" drop associated with transistor 27 once transistor 29 ceases to conduct. Again a current path is supplied for this transistor through the transistor 28.

It should be noted from the transistor sizes above described, the transistors employed in the invented buffer are relatively small when compared to the transistors in the prior art buffer. Thus, the buffer of FIG. 2 even though employing more devices than the prior art buffer, nonetheless requires less substrate area.

Thus, a voltage converting circuit or buffer has been described which converts a TTL signal to an MOS signal. Unlike the prior art buffers, the invented buffer's performance is less affected by short transistor channels.

We claim:

1. An integrated circuit for converting a first binary signal operating between first levels, to a second binary signal operating between second levels, comprising:

a first inverter coupled to receive said first binary signal as an input signal;

a reference voltage means for providing a reference voltage for said first inverter, said reference means coupled to said first inverter;

a second inverter for providing current to said reference means when said first binary signal is at one of said first levels, and for providing a current path for said first inverter when said first binary signal is at said other of said first levels, said second inverter coupled to said reference means and coupled to receive said first binary signal; and, level shifting means coupled to the output of said first inverter, for shifting the output signal from said first inverter when said first binary signal is at the other of said first level, said level shifting means coupled to receive said first binary signal;

whereby said output signal from said first inverter with said level shifting, provides said second binary signal.

2. The buffer defined by claim 1 wherein said first inverter comprises a depletion mode transistor and an enhancement mode transistor with said first binary signal being coupled to the gate of said enhancement mode transistor.

3. The buffer defined by claim 2 wherein said reference voltage of said reference means is at least equal to the threshold voltage of said enhancement mode transistor.

4. The buffer defined by claim 3 wherein said reference means comprises a second enhancement mode transistor.

5. The buffer defined by claim 4 wherein said level shifting means comprises a third enhancement mode transistor.

6. A metal-oxide-semiconductor (MOS) conversion stage for converting a transistor-transistor logic (TTL) signal to an MOS level signal, comprising:

a first inverter comprising a first depletion mode transistor coupled in series with a first enhancement mode transistor, the gate of said first enhancement mode transistor being coupled to receive said TTL signal;

a reference voltage means for generating a reference voltage, coupled to said first enhancement mode transistor;

a second inverter comprising a second depletion mode transistor coupled in series with a second enhancement mode transistor, the common node between these second transistors being coupled to said reference means and said first enhancement mode transistor, and the gate of said second enhancment mode transistor being coupled to receive said TTL signal; and, a level shifting means for shifting the level of the output signal from said first inverter to a lower level when said TTL signal is in its higher level, said level shifting means being coupled to said first inverter and coupled to receive said TTL signal;

whereby said output signal from said first inverter, after said level shifting provides an MOS level signal.

7. The conversion stage defined by claim 6 wherein said level shifting means comprises a third enhancement mode transistor, having its gate coupled to receive said TTL signal.

8. The conversion stage defined by claim 7 wherein said reference means comprises a fourth enhancement mode transistor.

9. The conversion stage defined by claim 8 including an additional depletion mode transistor coupled in series between said first transistors of said first inverter, the gate of said additional transistor being coupled to ground.

* * * * *